US006915141B2

(12) United States Patent
Loke

(10) Patent No.: US 6,915,141 B2
(45) Date of Patent: Jul. 5, 2005

(54) SECONDARY AUTOMATIC GAIN CONTROL LOOPS FOR DIRECT CONVERSION CDMA RECEIVERS

(75) Inventor: Aravind Loke, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 227 days.

(21) Appl. No.: 10/261,896

(22) Filed: Oct. 1, 2002

(65) Prior Publication Data

US 2003/0027610 A1 Feb. 6, 2003

Related U.S. Application Data

(63) Continuation of application No. 09/382,882, filed on Aug. 25, 1999, now Pat. No. 6,484,042.

(51) Int. Cl.[7] .......................... H04M 1/00; H04B 1/06; H04B 1/04; H04B 1/26; H04L 27/08
(52) U.S. Cl. ................. 455/550.1; 455/131; 455/194.2; 455/232.1; 455/234.1; 455/240.1; 455/250.1; 375/345
(58) Field of Search ............................. 455/132, 234.1, 455/234.2, 240.1, 193.1, 194.2, 232.1, 131, 136–139, 141, 230, 242.2, 334, 313, 314, 63.1, 530.1, 245.1–250.1; 375/345; 329/360; 342/92

(56) References Cited

U.S. PATENT DOCUMENTS

| | | | | |
|---|---|---|---|---|
| 4,584,710 A | * | 4/1986 | Hansen | 455/226.1 |
| 4,621,365 A | * | 11/1986 | Chiu | 375/149 |
| 4,731,796 A | * | 3/1988 | Masterton et al. | 375/9 |
| 5,283,536 A | * | 2/1994 | Wheatley et al. | 330/279 |
| 5,323,425 A | | 6/1994 | Colamonico et al. | |
| 5,469,115 A | * | 11/1995 | Peterzell et al. | 330/129 |
| 5,617,060 A | * | 4/1997 | Wilson et al. | 330/129 |

(Continued)

FOREIGN PATENT DOCUMENTS

| | | | | |
|---|---|---|---|---|
| EP | 0 308 891 A2 | * | 3/1989 | ........... H04L/27/06 |
| EP | 0 88 373 A1 | | 12/1998 | |
| FR | 2767992 | | 8/1998 | |
| GB | 2 312 344 A | * | 10/1997 | ............ H03G/3/20 |
| WO | WO 98/53579 | | 11/1998 | |
| WO | WO 95/30275 | | 5/2000 | |

OTHER PUBLICATIONS

RI 23107U Personal Communication Services (PCS) Power Amplifier (1850–1910 MHz) Data Sheet, Rockwell Semiconductor Systems, pp. 1–9, Aug. 25, 1998.

TIA–EIA Engineering Standards Proposal No. 3815, published by Telecommunications Industry Association, Dec. 3, 1997.

*Primary Examiner*—William Trost
*Assistant Examiner*—Meless Zewdu
(74) *Attorney, Agent, or Firm*—Knobbe, Martens, Olson & Bear LLP.

(57) ABSTRACT

A communications device includes a frequency conversion circuit and a control circuit. An antenna receives a radio signal at a first frequency and converts it into a radio frequency (RF) signal of the first frequency. The frequency conversion circuit is associated with the antenna and configured to convert the RF signal into a first signal component and a second signal component. The first and second signal components occupy a baseband. The control circuit has first ports connected to the frequency conversion circuit to receive the first and second signal components and second ports connected to a processor circuit to output amplified first and second signal components, and separate channels for the first and second signal components existing between the first and second ports. Each channel comprises an amplifier and a feedback loop configured to control the amplifier as a function of a reference signal and a control signal derived from the RF signal. The communications device may be a cellular phone comprising a direct conversion module.

31 Claims, 5 Drawing Sheets

U.S. PATENT DOCUMENTS

| | | | |
|---|---|---|---|
| 5,722,062 A | * | 2/1998 | Nakanishi et al. ......... 455/247.1 |
| 5,828,955 A | * | 10/1998 | Lipowski et al. ............ 455/324 |
| 5,878,089 A | * | 3/1999 | Dapper et al. ............... 375/325 |
| 5,898,906 A | * | 4/1999 | Williams ...................... 455/75 |
| 5,926,503 A | * | 7/1999 | Kelton et al. ................ 375/206 |
| 6,009,317 A | * | 12/1999 | Wynn ......................... 455/296 |
| 6,072,997 A | * | 6/2000 | Kawai ......................... 455/214 |
| 6,404,823 B1 | * | 6/2002 | Grange et al. .............. 375/297 |

* cited by examiner

SECONDARY AUTOMATIC GAIN CONTROL LOOPS FOR DIRECT CONVERSION CDMA RECEIVERS

This application is a continuation of U.S. patent application Ser. No. 09/382,882, filed on Aug. 25, 1999 now U.S. Pat. No. 6,484,042.

BACKGROUND OF THE INVENTION

1. Field of the Invention

The invention generally relates to a communications system. More particularly, the invention relates to a communications device and a method of receiving radio frequency signals within a communications system.

2. Description of the Related Art

One example of a communications system is a wireless communications system which may be a cellular mobile communications system. The cellular mobile communications system is implemented in a geographical area and logically divided into individual service cells. A fixed transceiver station such as a base station defines at least one cell and is connected to a base station controller. Mobile stations, such as hand-held or car-based cellular phones, move freely within the geographical area covered by a cell.

The base station handles all telephone traffic to and from those cellular phones which are currently located in the cell. In addition, the cellular phones and the base stations exchange radio signals in accordance with a communications protocol defined for a given communications system. For instance, in a conventional Code Division Multiple Access (CDMA) systems, a traffic channel, a pilot channel, and a paging channel are defined for communications between the base stations and the cellular phones. The pilot channel carries no information, but provides the cellular phone, for example, with a reference for time, phase and signal strength. The cellular phone constantly evaluates the strengths of the pilot channels of the serving and neighboring base stations to determine potential base stations should the cellular phone move from one cell to another.

In some cellular phones, a receiver includes two frequency conversion stages. A first conversion stage down converts a received radio frequency (RF signal) to an intermediate frequency (IF) signal whose intermediate frequency (IF) is lower than the radio frequency. An amplifier amplifies the IF signal and a second conversion stage down converts the amplified IF signal to the baseband.

Conventional direct conversion (DC) module receivers, on the other hand, convert the RF signal directly down to the baseband. The DC module outputs an inphase (I) signal component and a quadrature (Q) signal component which are, in turn, processed by a baseband processor. Subsequent to the downconversion, amplifiers amplify the signal components I and Q in separate I- and Q-channels. The amplifiers should amplify the signal components I and Q with gains that are ideally the same for each one of the signal components I and Q. Unfortunately, gain imbalances between the I- and Q-channels may degrade the signal demodulation in the baseband processor.

SUMMARY OF THE INVENTION

An aspect of the invention relates to a method of enhancing the direct conversion of a radio frequency signal. The method comprises converting a radio frequency (RF) signal into an I signal and a Q signal. The method further comprises varying the amplification of the I signal based on the comparison of the amplified I signal, a reference voltage, and a signal strength signal. The method also comprises varying the amplification of the Q signal based on the comparison of the amplified Q signal, the reference voltage and the received signal strength indicator signal.

An aspect of the invention involves a direct conversion receiver for a communications system. The receiver includes a frequency conversion circuit and a control circuit connected to the frequency conversion circuit. The frequency conversion circuit converts a radio frequency (RF) signal into a first signal component and a second signal component which occupy a baseband. The control circuit comprises first ports connected to the frequency conversion circuit to receive the first and second signal components and second ports connectable to a processor circuit to output amplified first and second signal components. Between the first and second ports exist separate channels for the first and second signal components. Each channel comprises an amplifier and a feedback loop to control the amplifier as a function of a reference signal and a control signal derived from the RF signal.

An aspect of the invention involves a wireless communications device that includes a frequency conversion circuit and a control circuit. An antenna receives a radio signal at a first frequency and converts it into an electrical radio frequency (RF) signal. The frequency conversion circuit is associated with the antenna and configured to convert the RF signal into a first signal component and a second signal component. The first and second signal components occupy a baseband. The control circuit has first ports connected to the frequency conversion circuit to receive the first and second signal components and second ports connected to a processor circuit to output amplified first and second signal components, and separate channels for the first and second signal components existing between the first and second ports. Each channel comprises an amplifier and a feedback loop configured to control the amplifier as a function of a reference signal and a control signal derived from the RF signal.

Another aspect of the invention involves an apparatus comprising a frequency conversion circuit and a control circuit. The frequency conversion circuit is configured to convert a first signal having a first frequency into a first signal component and a second signal component. The first and second signal components have a second frequency which is lower than the first frequency. The control circuit has first ports connected to the frequency conversion circuit to receive the first and second signal components and second ports connectable to a processor circuit to output amplified first and second signal components. The control circuit further has separate channels for the first and second signal components existing between the first and second ports. Each channel comprises an amplifier and a feedback loop configured to control the amplifier as a function of a reference signal and a control signal.

A further aspect of the invention involves a method of controlling power levels of first and second signal components, which are processed in separate channels. For each channel, one of the first and second signal components is amplified and a detector signal, which is indicative of a power level of one of the amplified first and second signal components, is generated. Further, an error signal, which is indicative of a difference between one of the amplified first and second signal components and a reference signal, is generated. The error signal and a control signal are summed to generate a gain control signal, and to adjust amplification of one of the first and second signal components.

Another aspect of the invention involves a method of controlling power levels of first and second signal components. The first and second signal components are processed in separate channels. In each channel one of the first and second signal components is amplified and amplification is controlled as a function of an error signal, which is indicative of a difference between the amplified signal component and a reference signal, and a sum of the error signal and a control signal.

For purposes of summarizing the invention, certain aspects, advantages and novel features of the invention have been described herein. Of course, it is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

These and other aspects, advantages, and novel features of the invention will become apparent upon reading the following detailed description and upon reference to the accompanying drawings.

DETAILED DESCRIPTION OF THE PREFERRED EMBODIMENT

Figure 1:
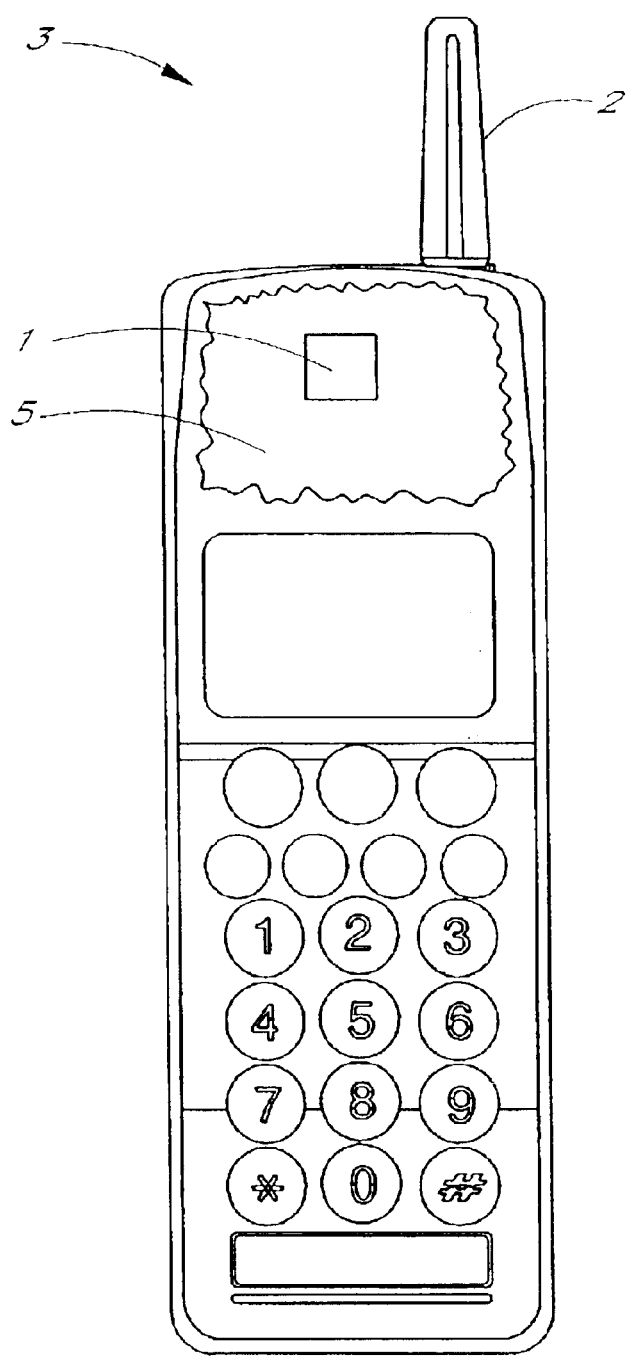
FIG. 1 is an illustration of a cellular phone.

FIG. 1 shows an embodiment of a wireless phone 3 as an example for a communications device that is operable in a communications system. The phone 3 is configured to communicate with a base station (not shown) located within the communications system. In one embodiment that is hereinafter described, the phone 3 is a cellular phone operable in a cellular mobile communications systems.

An exemplary cellular mobile communications system is a Code Division Multiple Access (CDMA) system. An embodiment of the present invention is hereinafter described with reference to, but not limited to, the phone 3 configured to operate within a CDMA system. It is contemplated that the present invention is equally applicable in the base stations of the CDMA system.

The phone 3 includes an antenna 2, a display and a keypad. A portion of the case of the phone 3 is cut away to show a motherboard 5 of the phone 3 with an integrated circuit 1 which includes an RF receiver, or a portion thereof, as described below. The integrated circuit 1 is hereinafter generally referred to as a receiver for radio frequency signals. Although not shown in FIG. 1, those skilled in the art will appreciate that the phone 3 comprises a central processor unit (CPU) and a plurality of other components and functional modules of conventional phones.

Figure 2:
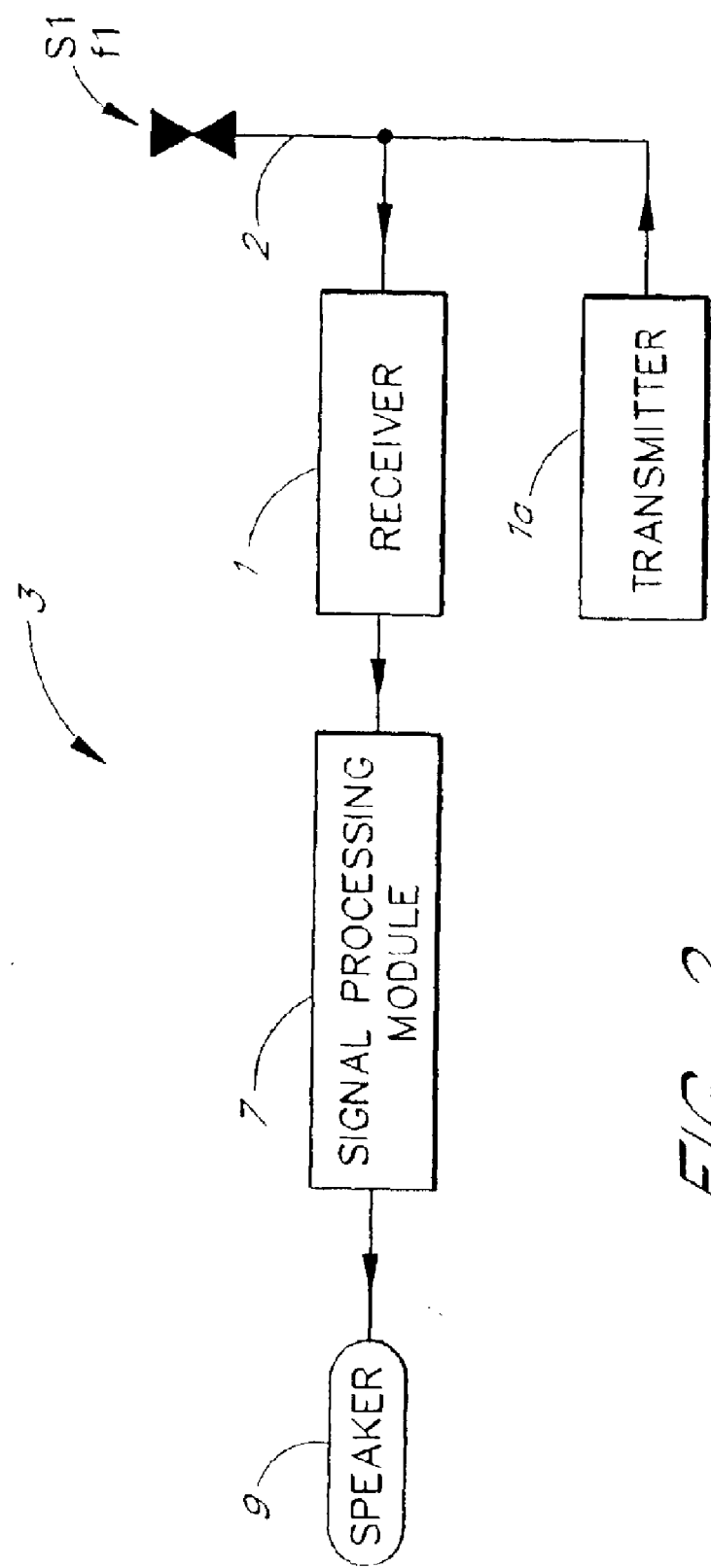
FIG. 2 is an illustration of a receive path of a cellular phone.

FIG. 2 shows a schematic illustration of a receive path and a transmit path of the phone 3. Both paths are associated with the antenna 2 to receive and transmit radio frequency (RF) signals. In the illustrated embodiment, the transmit path includes a conventional transmitter 1a for RF signals, and the receive path comprises the RF receiver 1 (hereinafter referred to as the receiver 1), a signal processing module 7 and a speaker 9. The receiver 1 is interconnected between the antenna 2 and the signal processing module 7 which is connected to the speaker 9.

The receiver 1 includes several groups of amplifiers which are separated by frequency-changing circuits (e.g., mixers, modulators or demodulators) to extract information carried by a weak signal voltage that appears at a terminal of the antenna 2. The antenna 2 receives a radio signal S1 having a carrier frequency f1, for example, from a serving base station and converts the radio signal S1 to a corresponding electrical signal. The electrical signal includes the carrier frequency f1, which is in the radio frequency range (e.g., 800 MHz, 900 MHz, 1800 MHz, or 1900 MHz), and is referred to as the RF signal.

As described below in greater detail, in one embodiment, the receiver 1 is a direct conversion (DC) receiver that converts the RF signal from an initial high frequency (RF) range directly down to a lower frequency range, the baseband. For instance, the baseband exists between about 0 Hz and about 630 kHz. Therefore, the receiver 1 outputs the radio signal S1 as a baseband signal which is input to the signal processing module 7 for further processing. Those skilled in the art will appreciate that the general concept of the invention is equally applicable in a receiver in which the down conversion process includes two stages. A first stage down converts the composite RF signal from the RF range to an intermediate frequency (IF) range, and a second stage down converts the RF signal from the intermediate frequency range to the baseband.

Figure 3:
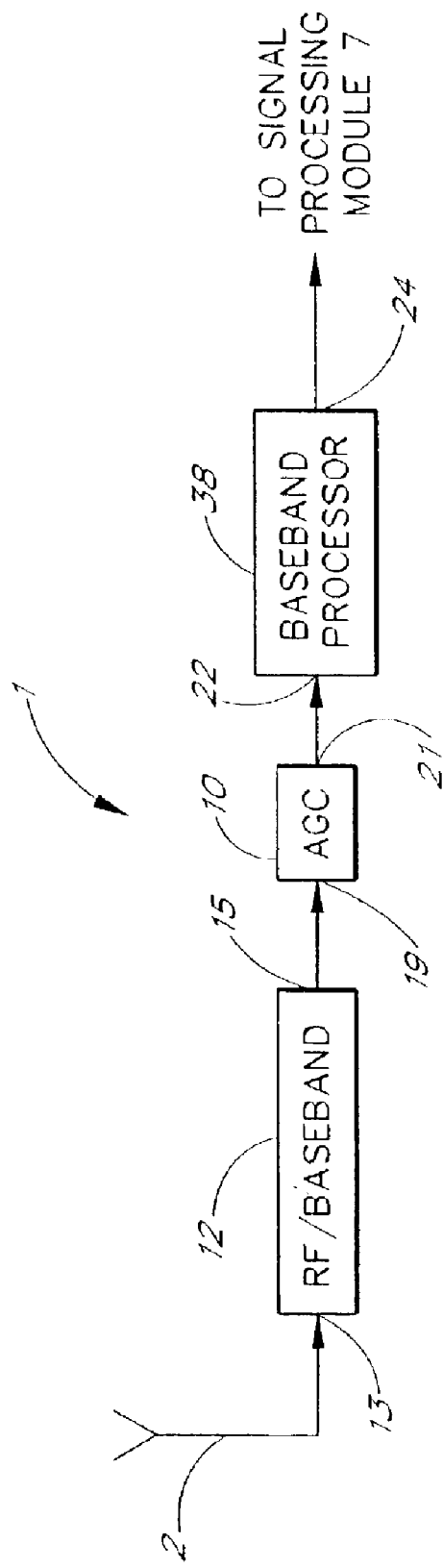
FIG. 3 is a block diagram of a receiver.

FIG. 3 shows a block diagram of the receiver 1. The receiver 1, interposed between the antenna 2 and the signal processing module 7, includes a frequency conversion module 12 (labeled as "RF/Baseband"), a gain control module 10 (labeled as "AGC"), and a baseband processor 38. An input 13 of the frequency conversion module 12 is connected to the antenna 2 and an output 15 of the frequency conversion module 12 is connected to an input 19 of the gain control module 10. The gain control module 10 has an output 21 which is connected to an input 22 of the baseband processor 38 an output 24 of which is connected to the signal processing module 7.

In one embodiment, the frequency conversion module 12 down converts the RF signal to the baseband whereby the frequency conversion module 12 splits the RF signal into two signal components, inphase I and quadriphase Q. The frequency conversion module 12 outputs the signal components I, Q at the output 21 which is connected to the gain control module 10. The gain control module 10 controls and amplifies the signal components I, Q. The signal components I, Q are input to the baseband processor 38 which performs the processing necessary to convert the received CDMA signal back to an uncoded ("de-spread") signal and extracts the voice/data signals.

As is known to the person skilled in the art, CDMA is a spread spectrum technique for multiple access. The CDMA technique is sometimes explained with reference to a situation encountered at a cocktail party. Like in a cellular CDMA system, all guests are talking in the same room simultaneously, but every conversation occurs in a different language. If one guest does not understand these languages, they would all sound like "noise" from the guest's perspective. However, if the guest would know the "code," i.e., the appropriate language, the guest could "filter out" the unknown languages (noise) and listen only to the conversation in the language the guest understands.

Besides the language (code) problem, the guest may encounter another problem. Even with knowledge of the appropriate language, the guest may not hear the complete conversation because either the speaker does not speak loud enough, or the other speakers speak too loud. The guest can signal to the speaker to speak louder, but can also signal to the other guests to speak more softly. The CDMA system applies a corresponding "power control" process and filter function.

Referring to a CDMA system, multiple telephone conversations are spread across a wide segment of a (broadcast) frequency spectrum at a transmitter and "de-spread" at the receiver. Each user (telephone call) is assigned a unique code to modulate transmitted data. The code is unique and distinguishes a specific call from the multitude of other calls simultaneously transmitted over the same broadcast spectrum. The code is a long sequence of ones and zeros similar to the output of a random number generator of a computer. The computer generates the code using a specific algorithm and the numbers appear to be random. Because the codes are nearly random, there is very little correlation between the different codes. In addition, there is very little correlation between a specific code and any time shift of that same code.

Thus, the distinct codes can be transmitted over the same time and the same frequencies and the signals can be decoded at the receiver by correlating the received signal which is the sum of all transmitted signals with each code. As the receiver has the correct code, it can decode the received signal, i.e., the receiver can select "its" conversation from all the others. With CDMA, all users on a 1.25 MHz-wide channel can share the same frequency spectrum because each user's conversation is differentiated utilizing CDMA's unique digital codes. That same 1.25 MHz of frequency spectrum is re-used in each cell in the network.

For instance, a base station (not shown) communicates with each phone every 1.25 milliseconds to control its power level. Every 1.25 milliseconds, the base station instructs the phone 3 to increase or decrease its power, depending upon its distance from the base station. The CDMA phone 3 transmits only the minimum power required to maintain a communications link in order to minimize power consumption of the phone 3. The receiver 1 monitors the received radio signal received at the carrier frequency f1. The derived RF signal is down converted to the baseband as described above and the signal strength of the received signal is determined. The signal strength, i.e., a composite signal strength of the pilot channel, the traffic channel, and the paging channel, is compared to a threshold value. If the phone 3 is too far away from the base station, and the phone's transmitted power cannot be increased, or if a neighboring base station provides for a better radio connection, the phone 3 is handed off to one of the neighboring cell/base stations.

In one embodiment, the receiver 1 is implemented as an integrated circuit and configured to operate at a voltage between 2.7 volts and 5 volts. The voltage may be provided by a re-chargeable battery, or if the phone 3 is mounted to a car, from the car battery. However, those skilled in the art will appreciate that the receiver 1 may be configured to operate at lower or higher voltages. Further, it is contemplated that not all components of the receiver 1 are necessarily integrated in the integrated circuit. That is, a specific implementation of the receiver 1 may have discrete and isolated components in combination with integrated circuits.

Figure 4:
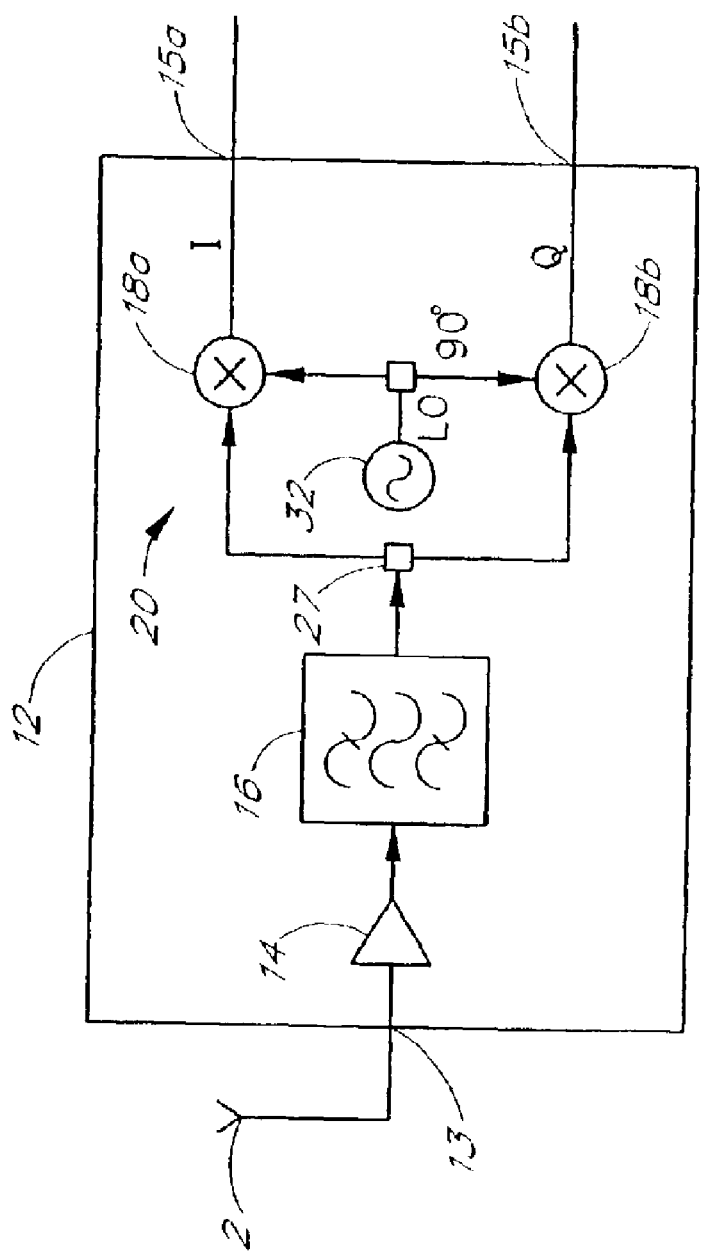
FIG. 4 is an illustration of a frequency conversion module.

FIG. 4 is an illustration of the frequency conversion module 12 shown in FIG. 3. The frequency conversion module 12 is shown in a single-ended embodiment. In another embodiment, the frequency conversion module 12, and thus the receiver 1, may be implemented in a differential embodiment. In some applications, the differential embodiment is preferred as it provides, among others, an improved common mode rejection and, consequently, improves the signal-to-noise ratio. If the receiver 1 is implemented in the differential embodiment, the components of the receiver 1 are connected between two differential lines which are typically referred to as "positive" and "negative", or "+" and "−." Compared to the single-ended embodiment, the components are duplicated for each differential line in the differential embodiment. The principal operation, however, corresponds to the operation of the single-ended embodiment.

Focusing on the single-ended implementation of the frequency conversion module 12, the frequency conversion module 12 comprises a combination of an amplifier 14, a filter 16, and a mixer stage 20 for signal amplification and frequency down conversion. The amplifier 14 is, for example, a low-noise amplifier (LNA) that receives the RF signal from the antenna 2 via the input 13, amplifies the RF signal, for example, with a gain of about 15 dB, and feeds the amplified RF signal to the mixer stage 20. The filter 16 is interconnected between the amplifier 14 and the mixer stage 20.

The filter 16 is in the illustrated embodiment a bandpass filter which limits the bandwidth of the RF signal received from the amplifier 14 to block undesired frequency components and to reduce out of band noise in the RF signal. In one embodiment, the passband of the filter 16 is about 25 MHz to allow passage of a receive band between about 850 MHz and 900 MHz, more precisely between 869 MHz and 894 MHz, and to block frequencies outside of this receive band.

The mixer stage 20 includes two separate mixers 18a, 18b and a local oscillator 32. The mixer 18a is connected to the output 15a of the frequency conversion module 12 and the mixer 18b is connected to the output 15b of the frequency conversion module 12. The mixers 18a, 18b are connected to the filter 16 through a port 27. The local oscillator 32 generates an oscillator signal LO which is, for example, a sinusoidal signal having a constant amplitude and oscillator frequency $f_{LO}$. The oscillator signal LO is input to the mixer 18a and, with a 90 degrees phase shift, to the mixer 18b. That is, in one embodiment, the mixers 18a, 18b receive signals having a sin function and a cosine function.

The oscillator frequency $f_{LO}$ is selected so that the RF signal, having the carrier frequency f1, is down converted to the baseband within approximately 0–630 kHz. In the direct conversion receiver 1, the oscillator frequency $f_{LO}$ is selected so that the oscillator frequency $f_{LO}$ is approximately equal to the carrier frequency f1.

The local oscillator is tunable to adapt to a change of the RF signal's carrier frequency f1. Such a change may be caused by operating the phone 3 within another phone system which operates, for example, at a carrier frequency of about 1800 MHz or 1900 MHz. Alternatively, the phone 3 may be a dual band cellular phone which can operate within different frequency bands, for example, 800 MHz, 900 MHz, 1800 MHz, or 1900 MHz. Independent of what carrier frequencies the RF signal has, the frequency the oscillator signal LO is generally selected so that the difference $f1-f_{LO}$ is approximately zero.

Although FIG. 4 shows the local oscillator 32 as belonging to the frequency conversion module 12, it is contemplated that the local oscillator 32 may be located outside the frequency conversion module 12 and at other locations within the phone 3. If the frequency conversion module 12 is implemented as an integrated circuit, the local oscillator 32 is typically located off-chip. In one embodiment, the local oscillator 32 is a conventional frequency synthesizer whose frequency is determined by piezoelectric crystals. The frequency synthesizer is tunable within a predetermined range. It is contemplated that other types of local oscillators, such as voltage controlled oscillators (VCO), may be used.

Each mixer 18a, 18b combines the RF signal and the oscillator signals LO and the signals mix with each other. As is known in the art, this mixing process results in a signal that includes a variety of different frequencies.

The mixer stage 20, implemented by the mixers 18a, 18b, splits the RF signal into the two signal components I, Q which correspond to I/Q components containing information transmitted by a base station. As shown, the mixer 18a outputs the signal component I, and the mixer 18b outputs the signal component Q. The signal components I, Q are input to the gain control module 10.

Figure 5:
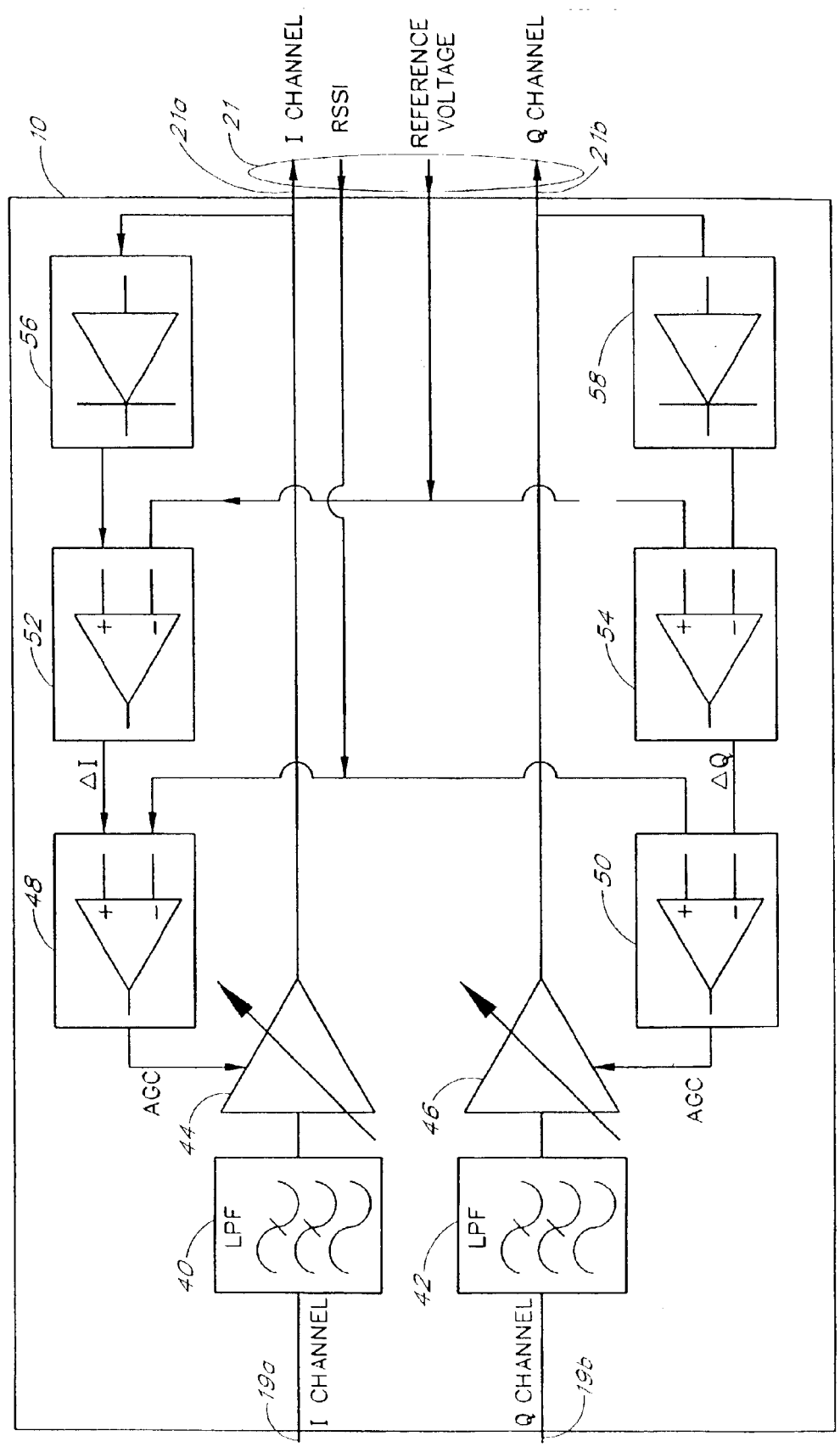
FIG. 5 is an illustration of a gain control module.

FIG. 5 is an illustration of the gain control module 10. The gain control module 10 includes an I-channel between the input 19a and an output 21a, and a Q-channel between the input 19b and an output 21b. The I- and Q-channels have the same structure and include corresponding elements, hence, only the structure of the I-channel is described hereinafter. The reference numerals for the corresponding elements of the Q-channel are included in parenthesis.

The I-channel (Q-channel) includes a filter 40 (42) and a controllable amplifier 44 (46). In the illustrated embodiment the filter 40 (42) is a low-pass filter connected to the input 19a (19b) and to an input of the amplifier 44 (46). An output of the amplifier 44 (46) is connected to the output 21a (21b) and to an input of a detector 56 (58), which is part of a feedback loop. In one embodiment, the low-pass filter 40 (42) has a cut-off frequency of about 630 kHz so that the low-pass filter 40 (42) blocks frequencies which are higher than the cut-off frequency in order to satisfy system requirements for rejecting interferences. It is contemplated that other values for the cut-off frequency may be chosen depending on a respective signal bandwidth.

The feedback loop includes further a difference amplifier 52 (54) and a summing amplifier 48 (50). The difference amplifier 52 (54) receives a detector signal that is proportional to a signal envelope at the output 21a (21b) from the detector 56 (58) and a reference signal (reference voltage), for example, from a reference-voltage source (not shown). The reference-voltage source may be temperature compensated. Alternatively, the reference voltage may be derived from the signal envelope at one of the I-and Q-channels. This contributes in reducing relative gain differences between the I-and Q-channels. The difference amplifier 52 (54) is a conventional operational amplifier which is powered by a voltage source that provides, for example, ∀5 volts, and which has an inverting input and a non-inverting input. In some applications, the operational amplifier may be connected to (external) resistors, inductors, and capacitors, for example, to stabilize the operational amplifier and to protect the operational amplifier from power peaks or undesired interferences.

The summing amplifier 48 (50) receives an error signal ΔI (ΔQ) from the difference amplifier 52 (54) and a signal RSSI. An output of the summing amplifier 48 (50) is connected to the amplifier 44 (46) to close the feedback loop. The summing amplifier 48 (50) may also be an operational amplifier that is powered, for example, by a ∀5-volt source, and has an inverting input and non-inverting input. It is contemplated that the gain control module 10 may be implemented as an integrated circuit or as a circuit including a combination of discrete components such as operational amplifiers, resistors, and capacitors.

The signal RSSI is generated by the baseband processor 38 and corresponds to the signal strength (amplitude) of the received radio signal S1. In a CDMA system, RSSI stands for Received Signal Strength Indicator. The signal RSSI is proportional to the sum of the squares of the signal components I, Q, i.e., RSSI–$I^2+Q^2$, so that the signal RSSI is a function of the two signal components I, Q.

Ideally, the signal components I, Q have the same power levels. However, in reality each amplifier 44, 46 may have a slightly different gain. Thus, if not regulated by the amplifiers 44, 46 and the feedback loops, the signal components I, Q may have different power levels after amplification causing an imbalance between the signal components I, Q. The subsequent baseband processing would receive the unbalanced signal components I, Q which would lead to signal degradation and an erroneous estimation of an open loop power.

The receiver 1 described herein, including the feedback loops, provides for more balanced signal components I, Q and, thus, reduces a signal degradation. As illustrated in FIG. 5, each I- and Q-channel includes one independent amplifier 44, 46, respectively, which are configured to have a high gain. Each amplifier 44, 46 is part of a separate feedback loop that uses the same reference signal and the same signal RSSI to control the amplifiers 44, 46. The amplifier 44 (46) receives a control signal AGC from the summing amplifier 48 (50) and is operable at a gain between +45 dB and −45 dB, i.e., over a dynamic range of 90 dB, to amplify the signal component I (Q) to a predetermined level over the dynamic range of the receiver 1. This structure ensures, as described below in greater detail, that the signal levels of the signal components I and Q are independently tracked and controlled. As the gain of each amplifier 44, 46 is controlled independent from the other, the gains of the amplifiers 44, 46 can be closely matched reducing any degradation in the signal demodulation of the baseband processor 38.

The detector 56 (58) is configured to detect the envelope (signal level) of the signal component I (Q). Such an envelope detector may include a diode and a network of a resistor and a capacitor (RC network). In one embodiment, the detector signal is a voltage having a value that is proportional to the signal level of the signal component I (Q). Those skilled in the art will appreciate that a more complicated envelope detector may be used and that instead of a voltage a current can used as the detector signal.

The difference amplifier 52 (54) compares the detector signal to the reference signal and generates the error signal ΔI (ΔQ) that is indicative of the difference between the detector signal and the reference signal. The difference corresponds to a direct current (DC) offset of the signal component I (Q) with respect to the reference signal. For instance, if the difference is zero, the error signal ΔI (ΔQ) is zero, and if the difference is positive (i.e., detector signal>reference signal) the error signal ΔI (ΔQ) is positive. Generally, the error signal ΔI (ΔQ) indicates how much the (present) signal level of the signal component I (Q) deviates from the desired (nominal) value of the signal level that is represented by the reference signal.

The summing amplifier 48 (50) uses the error signal ΔI (ΔQ) and the signal RSSI to adjust the gain of the amplifier 44 (46) to either increase or decrease the signal level of the signal component I (Q). The summing amplifier 48 (50), thus, generates a control signal AGC that is not only a function of the error signal ΔI (ΔQ) but also a function of the signal RSSI. The control signal AGC, thus, has the signal RSSI as a nominal value to which the error signal ΔI (ΔQ) is added or subtracted to control the amplifier 44 (46) so that the signal component I is balanced with the signal component Q.

The gain control module 10 permits to calibrate the I- and Q-channels so that any amplitude imbalance between the signal components I, Q are reduced. The baseband processor 38, thus, receives the signal components I, Q that have the same amplitude, outputs an improved signal that is input to the signal processing module 7.

While the above detailed description has shown, described and identified several novel features of the invention as applied to different embodiments, it will be understood that various omissions, substitutions and changes in the form and details of the described embodiments may be made by those skilled in the art without departing from the spirit of the invention. Accordingly, the scope of the invention should not be limited to the foregoing discussion, but should be defined by the appended claims.

What is claimed is:

1. An apparatus, comprising:
   a frequency conversion circuit configured to convert a first signal having a first frequency into a first signal component and a second signal component, the first and second signal components having a second frequency which is lower than the first frequency; and
   a control circuit having first ports connected to the frequency conversion circuit to receive the first and second signal components and second ports connectable to a processor circuit to output amplified first and second signal components, comprising:
      a first channel for the first signal component existing between the first and second ports, wherein the first channel comprises a first amplifier and a first feedback loop configured to control the first amplifier as a function of a reference signal and a control signal, the first feedback loop not configured to control the first amplifier as a function of the second signal component; and
      a second channel for the second signal component existing between the first and second ports, wherein the second channel comprises a second amplifier and a second feedback loop configured to control the second amplifier as a function of the reference signal, and the control signal, the second feedback loop not configured to control the second amplifier as a function of the first signal component.

2. The apparatus of claim 1, wherein the first feedback loop includes a first detector configured to generate a first detector signal indicative of an amplified first signal component, and the second feedback loop includes a second detector configured to generate a second detector signal indicative of an amplified second signal component.

3. The apparatus of claim 2, wherein the first feedback loop further includes a first difference amplifier configured to generate a first error signal indicative of a difference between the first detector signal and the reference signal, and the second feedback loop includes a second difference amplifier configured to generate a second error signal indicative of the difference between the second detector signal and the reference signal.

4. The apparatus of claim 3, wherein the first feedback loop further includes a first summing amplifier configured to generate a first gain control signal for the first amplifier, the first gain control signal being a function of the first error signal and the control signal, and the second feedback loop further includes a second summing amplifier configured to generate a second gain control signal for the second amplifier, the second gain control signal being a function of the second error signal and the control signal.

5. The apparatus of claim 4, wherein the first gain control signal is equal to the control signal modified by the first error signal, and the second gain control signal is equal to the control signal modified by the second error signal.

6. The apparatus of claim 2, wherein the first and second detectors are envelope detectors.

7. A method of enhancing the direct conversion of a radio frequency signal comprising:
   converting a radio frequency (RF) signal into an I signal propagating in an I channel and a Q signal propagating in a Q channel;
   varying an amplification of the I signal based on a comparison of an amplified I signal, a reference voltage, and a received signal strength indicator signal wherein the amplification of the I signal is not a function of the Q signal; and
   varying an amplification of the Q signal based on a comparison of an amplified Q signal, the reference voltage and the received signal strength indicator signal wherein the amplification of the Q signal is not a function of the I signal.

8. The method of claim 7, wherein varying the amplification of the I signal generates an error signal representing the difference between the amplified I signal and the reference voltage.

9. The method of claim 8, wherein the varying the amplification of the I signal combines the error signal with the received signal strength indicator signal to determine an amount to vary the amplification.

10. The method of claim 7, wherein varying the amplification of the Q signal generates an error signal representing the difference between the amplified Q signal and the reference voltage.

11. The method of claim 10, wherein the varying the amplification of the amplified Q signal combines the error signal with the received signal strength indicator signal to determine an amount to vary the amplification.

12. A wireless communications device, comprising:
   an antenna to receive a radio signal at a first frequency and to convert it into a radio frequency (RF) signal of the first frequency;
   a frequency conversion circuit associated with the antenna and configured to convert the RF signal into a first signal component and a second signal component, the first and second signal components occupying a baseband;
   a first channel for the first signal component wherein the first channel comprises a first amplifier and a first feedback loop configured to control the first amplifier as a function of a reference signal, a control signal derived from the RF signal, and not as a function of the second signal component; and
   a second channel for the second signal component wherein the second channel comprises a second amplifier and a second feedback loop configured to control the second amplifier as a function of the reference signal, the control signal derived from the RF signal, and not as a function of the first signal component.

13. The device of claim 12, wherein the first channel further comprises a first filter to block undesired frequencies of the first signal component and the second channel further comprises a second filter to block undesired frequencies of the second signal component.

14. The device of claim 13, wherein the first and second filters are low-pass filters having a cut-off frequency of about 630 kHz.

15. The device of claim 12, wherein the first feedback loop includes a first detector configured to generate a first detector signal indicative of an amplified first signal component and the second feedback loop includes a second detector configured to generate a second detector signal indicative of an amplified second signal.

16. The device of claim 15, wherein the first feedback loop further includes a first difference amplifier configured to generate a first error signal indicative of a difference between the first detector signal and the reference signal and the second feedback loop further includes a second difference amplifier configured to generate a second error signal indicative of the difference between the second detector signal and the reference signal.

17. The device of claim 16, wherein the first feedback loop further includes a first summing amplifier configured to generate a first gain control signal for the first amplifier, the first gain control signal being a function of the first error signal and the control signal, and the second feedback loop further includes a second summing amplifier configured to generate a second gain control signal for the second amplifier, the second gain control signal being a function of the second error signal and the control signal.

18. The device of claim 17, wherein the first gain control signal is equal to the control signal modified by the first error signal, and the second gain control signal is equal to the control signal modified by second error signal.

19. The device of claim 15, wherein the first and second detectors are envelope detectors.

20. The device of claim 12, wherein the device is configured to operate within a code division multiple access (CDMA) system.

21. The device of claim 20, wherein the control signal is a received signal strength information (RSSI) defined in the CDMA system.

22. A method of controlling power levels of first and second signal components, which are processed in separate channels, the method comprising for a first channel:
amplifying a first signal component;
generating a first detector signal indicative of a power level of the amplified first signal component;
generating a first error signal indicative of a difference between an amplified first signal component and a reference signal;
combining the first error signal and a control signal to generate a first gain control signal; and
adjusting amplification of the first signal component, wherein the power level of the first signal component is not a function of the second signal component, and
the method comprising for a second channel:
amplifying a second signal component;
generating a second detector signal indicative of a power level of an amplified second signal component;
generating a second error signal indicative of a difference between the amplified second signal component and the reference signal;
combining the second error signal and the control signal to generate a second gain control signal; and
adjusting amplification of the second signal component, wherein the power level of the second signal component is not a function of the first signal component.

23. The method of claim 22, further comprising blocking undesired frequencies of one of the first and second signal components.

24. A method of controlling power levels of first and second signal components, which are processed in separate channels, the method for a first channel comprising the acts of:
amplifying a first signal component; and
controlling amplification as a function of a first error signal indicative of a difference between a first amplified signal component and a reference signal, and a sum of the first error signal and a control signal, and not a function of a second signal component, and
the method for a second channel comprising the acts of:
amplifying the second signal component; and
controlling amplification as a function of a second error signal indicative of a difference between a second amplified signal component and the reference signal, and a sum of the second error signal and the control signal, and not a function of the first signal component.

25. The method of claim 24, wherein the acts of controlling comprise compensating the first and second signal components for direct current (DC) offsets with respect to the reference signal.

26. The method of claim 25, wherein the acts of controlling further comprise compensating the first and second signal components for amplitude imbalances between the first and second signal components using the control signal.

27. The method of claim 26, wherein the control signal represents the power level of a received radio signal.

28. A direct conversion receiver, comprising:
a frequency conversion circuit to convert a radio frequency (RF) signal into a first signal component and a second signal component, the first and second signal components occupying a baseband; and
a control circuit having first ports connected to the frequency conversion circuit to receive the first and second signal components and second ports connectable to a processor circuit to output amplified first and second signal components comprising:
a first channel for the first signal component existing between the first and second ports, the first channel comprising a first amplifier and a first feedback loop to control the first amplifier as a function of a reference signal and a control signal derived from the RF signal and not as a function of the second signal component, and
a second channel for the second signal component existing between the first and second ports, the second channel comprising a second amplifier and a second feedback loop to control the second amplifier as a function of the reference signal and the control signal derived from the RF signal and not as a function of the first signal component.

29. The receiver of claim 28, wherein the first feedback loop includes a first difference amplifier which compares a signal strength of the first signal component with the reference signal to generate a first error signal, and the second feedback loop includes a second difference amplifier which compares a signal strength of the second signal component with the reference signal to generate a second error signal.

30. The receiver of claim 29, wherein the first feedback loop includes a first summing amplifier which combines the control signal and the first error signal to generate a first gain control signal for the first amplifier, and the second feedback loop includes a second summing amplifier which combines the control signal and the second error signal to generate a second gain control signal for the second amplifier.

31. A method of enhancing the direct conversion of a radio frequency signal comprising:

converting a radio frequency (RF) signal into a first signal component propagating in a first channel and a second signal component propagating in a second channel;

varying an amplification of the first signal component based on a comparison of an amplified first signal component, a reference voltage, and a received signal strength indicator signal wherein the amplification of the first signal component is not a function of the second signal component; and varying an amplification of the second signal component based on a comparison of an amplified second signal component, the reference voltage and the received signal strength indicator signal wherein the amplification of the second signal component is not a function of the first signal component.

* * * * *